(12) United States Patent
Kitahara (10) Patent No.: US 7,757,038 B2
(45) Date of Patent: Jul. 13, 2010

(54) STORAGE DEVICE AND STORING METHOD

(75) Inventor: Jun Kitahara, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 640 days.

(21) Appl. No.: 11/622,168

(22) Filed: Jan. 11, 2007

(65) Prior Publication Data
US 2008/0098158 A1 Apr. 24, 2008

(30) Foreign Application Priority Data
Oct. 20, 2006 (JP) ............................. 2006-286108

(51) Int. Cl.
*G06F 12/06* (2006.01)
(52) U.S. Cl. ................ 711/103; 711/114; 711/E12.008
(58) Field of Classification Search ................. 711/103, 711/114; 177/103, 114

See application file for complete search history.

(56) References Cited

U.S. PATENT DOCUMENTS

2005/0102603 A1* 5/2005 Tapper et al. ............... 714/770

* cited by examiner

*Primary Examiner*—Reginald G Bragdon
*Assistant Examiner*—Kenneth M Lo
(74) *Attorney, Agent, or Firm*—Brundidge & Stanger, P.C.

(57) ABSTRACT

To enable a capacity of an entire storage device to be kept by adding a flash drive or a flash module in the flash drive for a flash memory that has a failure, even if the storage device using the flash memory has a failure in its part such as a part of flash memory chip has a failure, for example, the flash memory chip has run out of its lifetime. In a storage device 101 equipped with two or more memory device units 105 with a plurality of semiconductor memory devices 107, each of which has a functional capacity unit 109 smaller than a capacity of an entire semiconductor memory device and has a writing lifetime for each functional capacity unit, only a functional capacity unit whose writing lifetime is run out to be determined as unable to be written is substituted by a functional capacity unit in a memory device of the other memory device unit to keep a predetermined capacity of the entire device.

12 Claims, 12 Drawing Sheets

STORAGE DEVICE AND STORING METHOD

The present application is based on and claims priority of Japanese patent application No. 2006-286108 filed on Oct. 20, 2006, the entire contents of which are hereby incorporated by reference.

BACKGROUND OF THE INVENTION

1. Field of the Invention

The present invention relates to a storage device and a storing method, and more specifically, to a controlling method and an implementing method of a flash memory for enhancing reliability of a storing system using a flash memory.

2. Description of the Related Art

As a non-volatile semiconductor memory, there is a flash memory for which a deletion unit or a writing unit (functional capacity unit) is previously determined. The flash memory has a floating gate structure, which wraps a conductor such as a polysilicon in an oxide insulator such as an oxide silicon for storing information by the presence of the charge, which is in the floating gate. The flash memory may use a structure for reserving a charge in a particular place other than the floating gate structure.

When the charge is filled or drawn in the floating gate structure, the charge is moved while dielectric breakdown is performed on the oxide insulator, or the charge is moved with the tunnel effect of an oxide film. Consequently, the insulator is degraded. As such, the flash memory has a lifetime, with limited number of deletion and limited number of rewriting for each capacity of deletion unit.

A method for prolonging the lifetime of non-volatile semiconductor memory with a lifetime for each deletion unit capacity includes a method for evening up the number of deletion for each deletion unit over the entire chip and a method for enabling the non-volatile semiconductor memory to keep operating as a memory device without a problem even if some deletion units cannot be used by providing a substitute region for substituting the part of the deletion units whose lifetime has expired.

The methods can prolong the lifetime, however, cannot eliminate the lifetime. The flash memory has a lifetime and it dies if the lifetime has expired.

As there is a technique for prolonging a lifetime of the flash memory in the conventional art, it is impossible to eliminate the lifetime. As such, a storage system using a flash memory needs a mechanism for compensating a part of the flash memory whose lifetime has expired even when the lifetime has expired in that part. At that moment, a failure occurs that a part of the flash memory is impossible to be deleted or written. In such a case, new data merely cannot be written in the part and already stored data can be read out without any problem. Therefore, it is effective to substituting only a part, in which deleting or writing is impossible, with another means leaving the remainder kept being used.

As such, when a part of the flash memory has a failure, the part with the failure is substituted with another part, but it is required to manage which part has a failure and which part substitutes the part with the failure. Therefore, it is required to manage the logical address and the physical address for each deletion unit so as to manage which logical address is served by each deletion unit of the flash memory and which flash memory has corresponding data when the logical address is indicated.

The management of the logical address and the physical address is performed by the superior system, there is a problem in that the management table becomes too large, raising an implementing cost for a required memory or the like. There is a problem in that it takes much time in converting the logical address and the physical address and the performance is lowered when it is attempted to reduce the cost.

There is also a method for exchanging memory device including a deletion unit whose lifetime has expired in an external storage device in maintenance for keeping the capacity. The method has a problem in that it is ineffective to exchange a memory device when only a part of the memory device has become unavailable.

SUMMARY OF THE INVENTION

The present invention is adapted, when one deletion unit in the flash drive or the like has a failure, to cause another flash drive to substitute the deletion unit. For that purpose, the present invention is adapted to cause the superior controlling unit to mange which logical address is mapped for each deletion unit, i.e., to manage association between the logical address and the physical address.

On the other hand, the present invention is adapted to transfer the logical address to the flash drive without managing association between the logical address and the physical address in the superior controlling unit, cause each flash drive to determine whether data corresponding to the logical address is stored or not and return the result, and output the data.

The present invention is adapted to inquire the logical address for all the flash drives, which makes up the RAID group, in the system for improving reliability of data by integrating a plurality of flash drives such as RAID. The present invention is adapted to set a range for logical addresses to be served for each RAID group and the logical addresses in a served range are inquired in parallel for each of different RAID groups.

The present invention is adapted to return information on whether a writing request from the superior controlling unit can be addressed or not to the superior controlling unit when data is written, cause the superior controlling unit to form a RAID parity group from a flash drive that can answer the writing request and write data.

The present invention is adapted to cause each flash drive among the flash drive forming a parity group to store data order and parity data classifying information instructed by the superior controlling unit by logical address unit as the flash drives forming a parity group differ for each logical address.

The present invention is adapted to cause the flash drive to save information indicating invalidity of the stored data, if the flash dive cannot address a writing request but a writing request is given from the superior controlling unit and the data corresponding to the logical address is stored.

The present invention is adapted to cause the flash drive to inform the superior controlling unit on the maximum value of the number of deletion of a deletion unit, and cause the superior controlling unit to issue a request to add a flash drive to the RAID group including the flash drive to an administrator, when the number of deletion reaches a predetermined number of times.

On the other hand, the present invention is adapted to add a flash module of a print substrate structure in which a flash memory is provided for the flash drive whose maximum number of deletion reaches a predetermined number of times to the flash drive so that the substituting region in the flash drive can be added.

With a configuration of sharing a substituting region between the flash drives, the least number of flash drives start to operate at first, and when the number of deletion reaches a predetermined number of times, a new flash drive is added for substituting the deletion unit the original flash drive whose lifetime has expired. Data is gradually transferred to a flash drive, to which substitutions are added, with valid data among data stored in the original flash drive decreasing. The present invention is adapted to transfer the valid data in the flash drive to the added drive and remove the flash drive, when a predetermined threshold is exceeded. Alternatively, the present invention is adapted to remove the flash drive and that on the removed flash drive is restored on the added drive by using the redundancy of the RAID, when the predetermined threshold is exceeded.

Alternatively, the present invention is adapted to enable the flash drives by twice the number of the minimum number of the flash drives, which form the RAID, to be connected in a RAID group.

According to the present invention, if a storage device using a flash memory has a failure in its part such as a part of a flash memory chip has a failure, for example, the flash memory chip has run out of its lifetime, a capacity of the entire storage device can be kept by adding a flash drive or a flash module in the flash drive for a flash memory that has a failure.

DETAILED DESCRIPTION OF THE PREFERRED EMBODIMENTS

The preferred embodiments to implement the present invention will be described.

Examples of the storage device and the storing method according to the present invention will be described with reference to the drawings.

Embodiment 1

Figure 1:
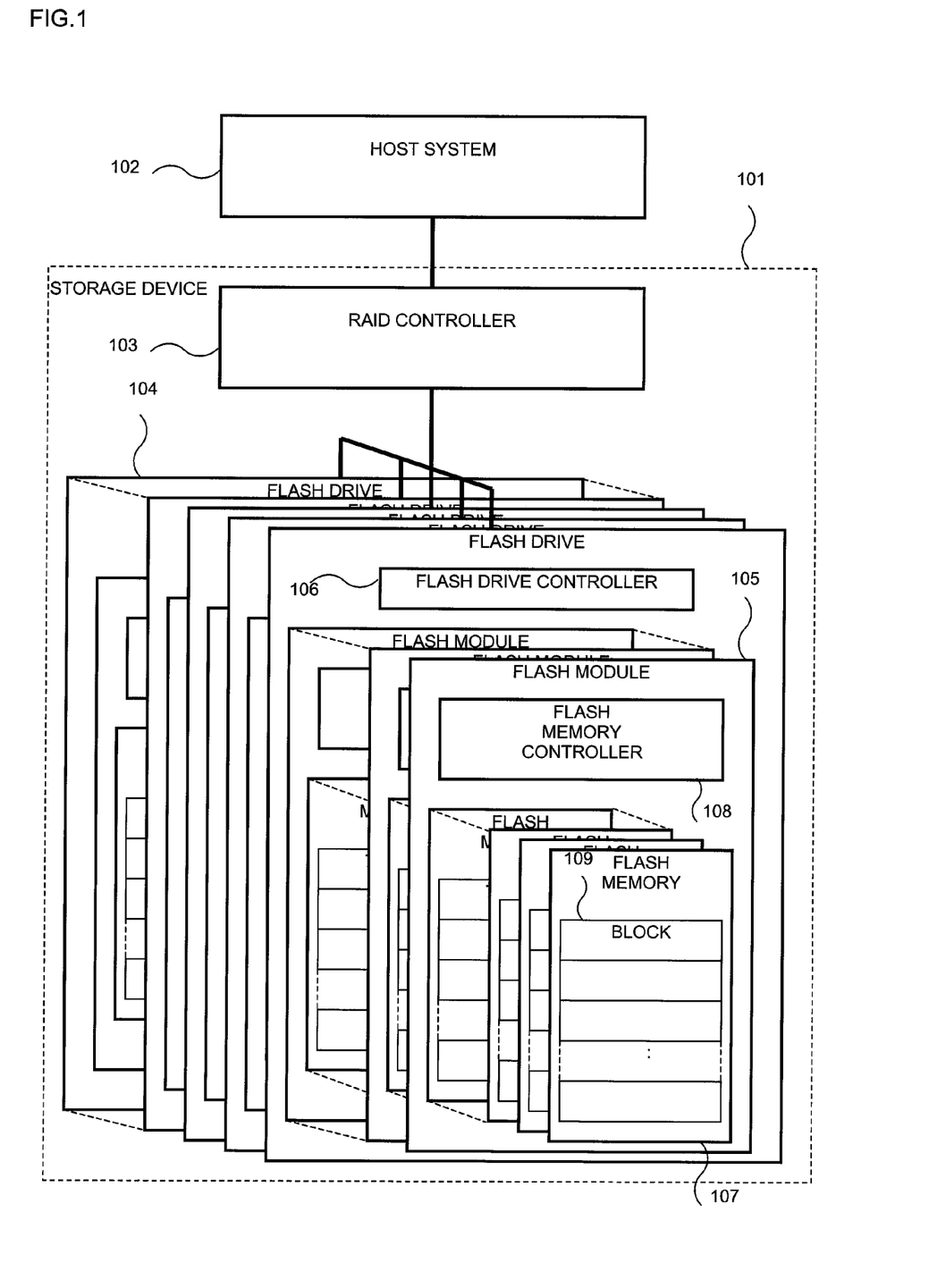
FIG. 1 is a schematic diagram of a system configuration of a storage device of an example.

The first embodiment of the present invention will be described by using FIGS. 1 to 6 and FIGS. 8, 9, and 11. FIG. 1 shows a configuration of a storage device 101 of the embodiment. The storage device 101 includes a plurality of flash drives 104 and a RAID controller 103, which controls the plurality of flash drives 104 in the storage device 101. The storage device 101 is connected to a host system 102 via the RAID controller 103.

The flash drive 104 includes a plurality of flash modules 105, each of which is a printed board provided with a plurality of flash memory devices 107 and a flash memory controller 108. A flash drive controller 106 interfaces exchanges between the flash module 105 and the RAID controller 104, the superior controlling unit of the flash module 105.

Figure 2:
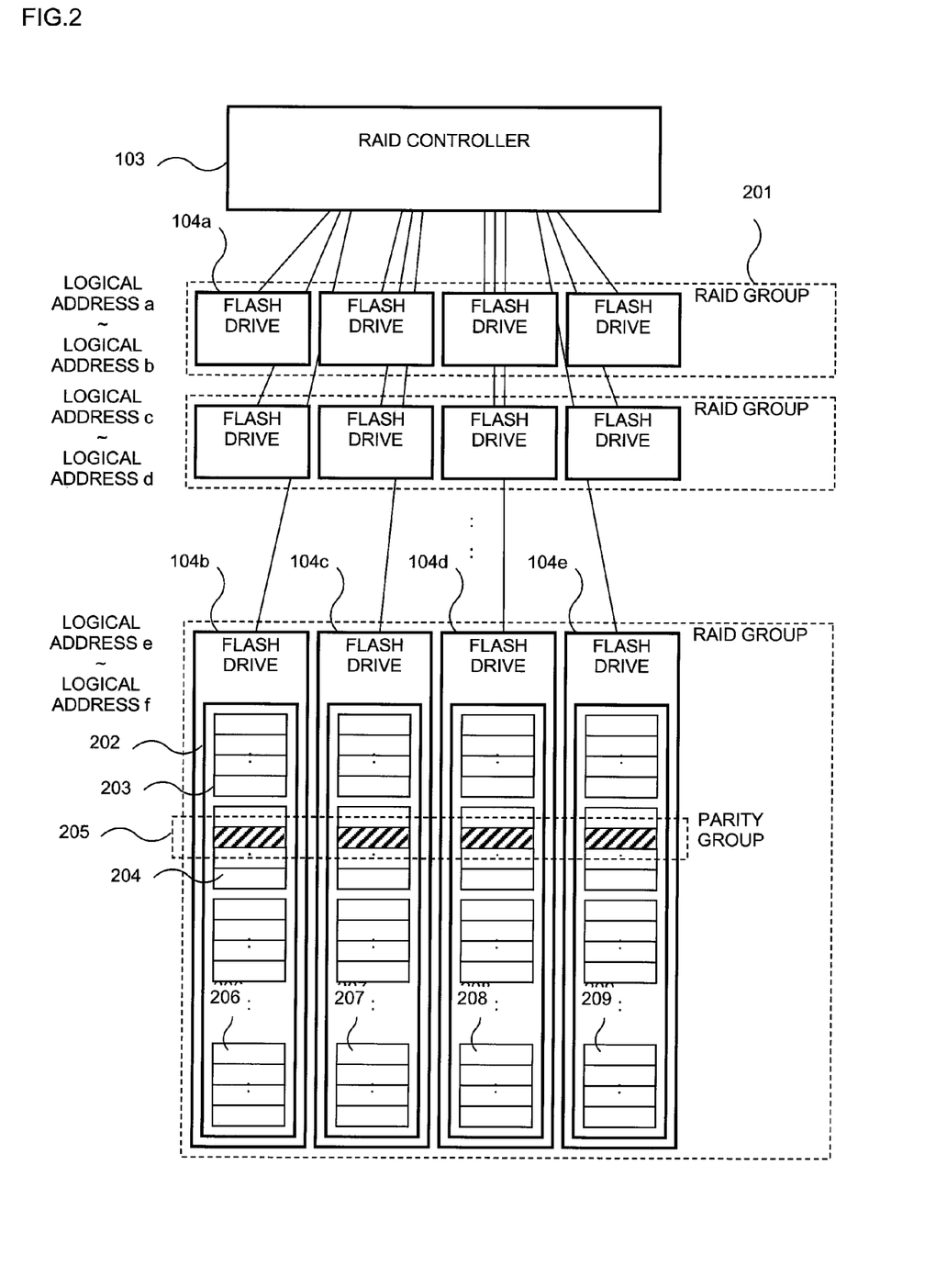
FIG. 2 is a schematic diagram of a RAID configuration.

The storage device 101 that puts much stress on reliability has a plurality of flash drives 104, for example, with four flash drives forming a RAID group 201. The RAID controller 103 allocates a logical address to a unit of the RAID group 201. The flash drive 104 includes a plurality of flash modules 105. Each flash module includes multiple flash memory devises 107. In FIG. 2, a flash memory device 202 includes a deletion unit 203, which is called a block, and a writing unit 204, which is called a page. The writing unit 204 corresponds to a sector as it is called in an HDD but the writing unit 204 may be formed with a plurality of sectors.

By taking a case where four flash drives form a RAID 5 as an example, the RAID controller 103 forms the RAID group 201 with four flash drives 104 and manages a plurality of RAID group. A logical address is allocated to each of the RAID groups according to a capacity of the RAID group. The logical address corresponds to a logical address given by the superior host system 102.

In the RAID group 201, a writing unit 204 with a deletion unit 203 in a flash memory chip 202 corresponding to the logical address is selected from each flash drive 104 to form a parity group 205 by four writing units. The RAID controller reads data by a parity group unit 205.

Figure 3:
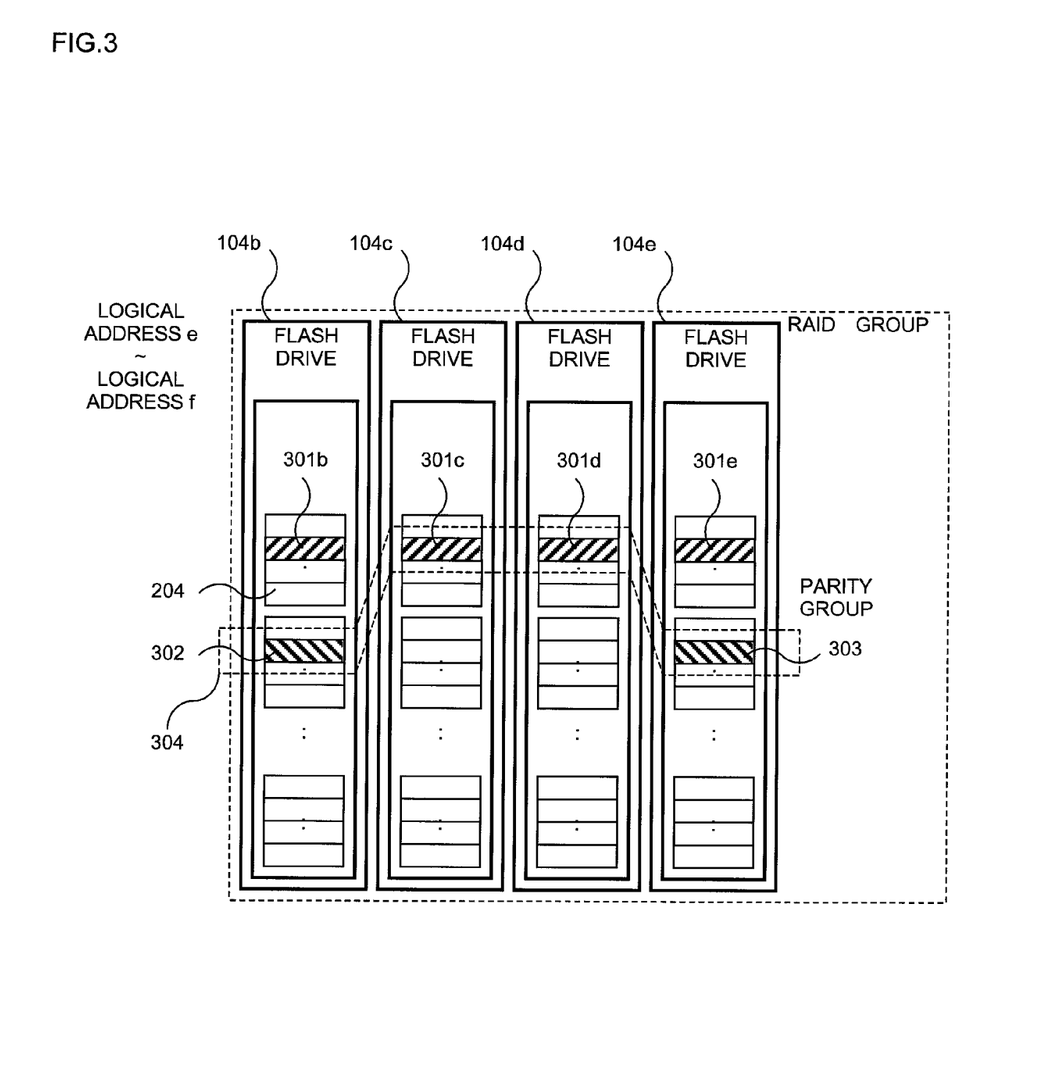
FIG. 3 is a schematic diagram of updating parity group data.

In FIG. 3, by taking a case where a writing unit 301b in a parity group is updated as an example, data of the updated writing unit and data of writing unit 301e that stores party data of the RAID are updated anew. This is because the flash memory is effective in reducing the number of times to rewrite as it is limited in the number of times to rewrite so that only the necessary part is to be rewritten.

In the case of a storage medium using the flash memories, it takes much time in deleting. Thus, a new updated data is written in the writing unit 302 of the other deleted deletion unit, and the RAID parity data is written in the writing unit 303 of the other deleted deletion unit to form a new parity group 304.

Figure 4:
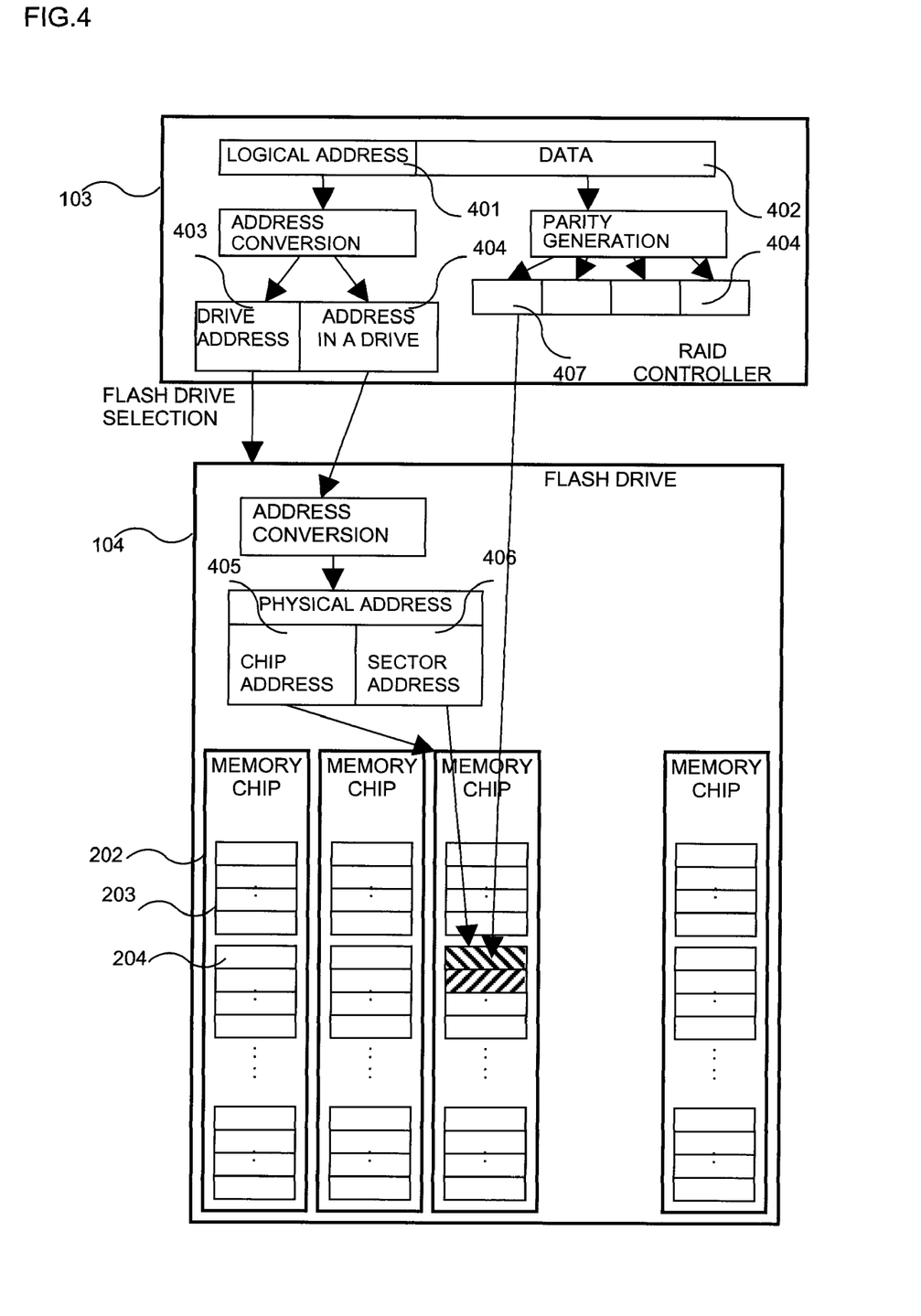
FIG. 4 is a schematic diagram of managing a physical address in a flash memory.

As shown in FIG. 4, looking at the entire external storage device, each data is managed by a logical address. The logical addresses are converted into an address of a specific drive, an address of a specific flash memory chip, an address of a specific deletion unit in a chip, and an address of a specific writing unit by the RAID controller or the flash drive controller.

Figure 5:
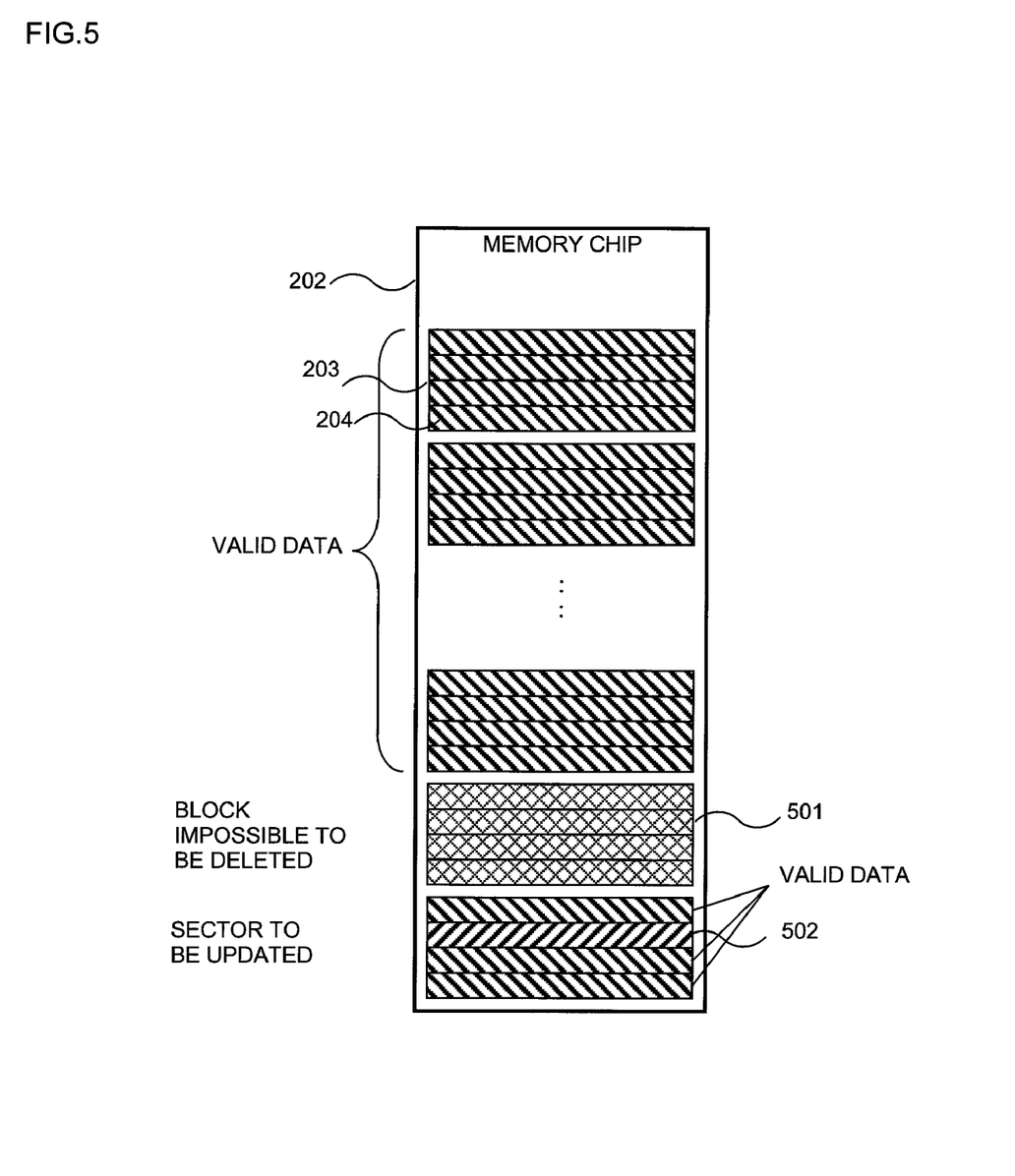
FIG. 5 is a schematic diagram of a failure in a flash memory.

In FIG. 5, a flash memory is limited in the number of times to delete/rewrite. If the flash memory has a great number of pieces of valid data, the deleted deletion unit that can be written decreases to be finally eliminated. In such state, it can address reading but hard to address writing.

Figure 6:
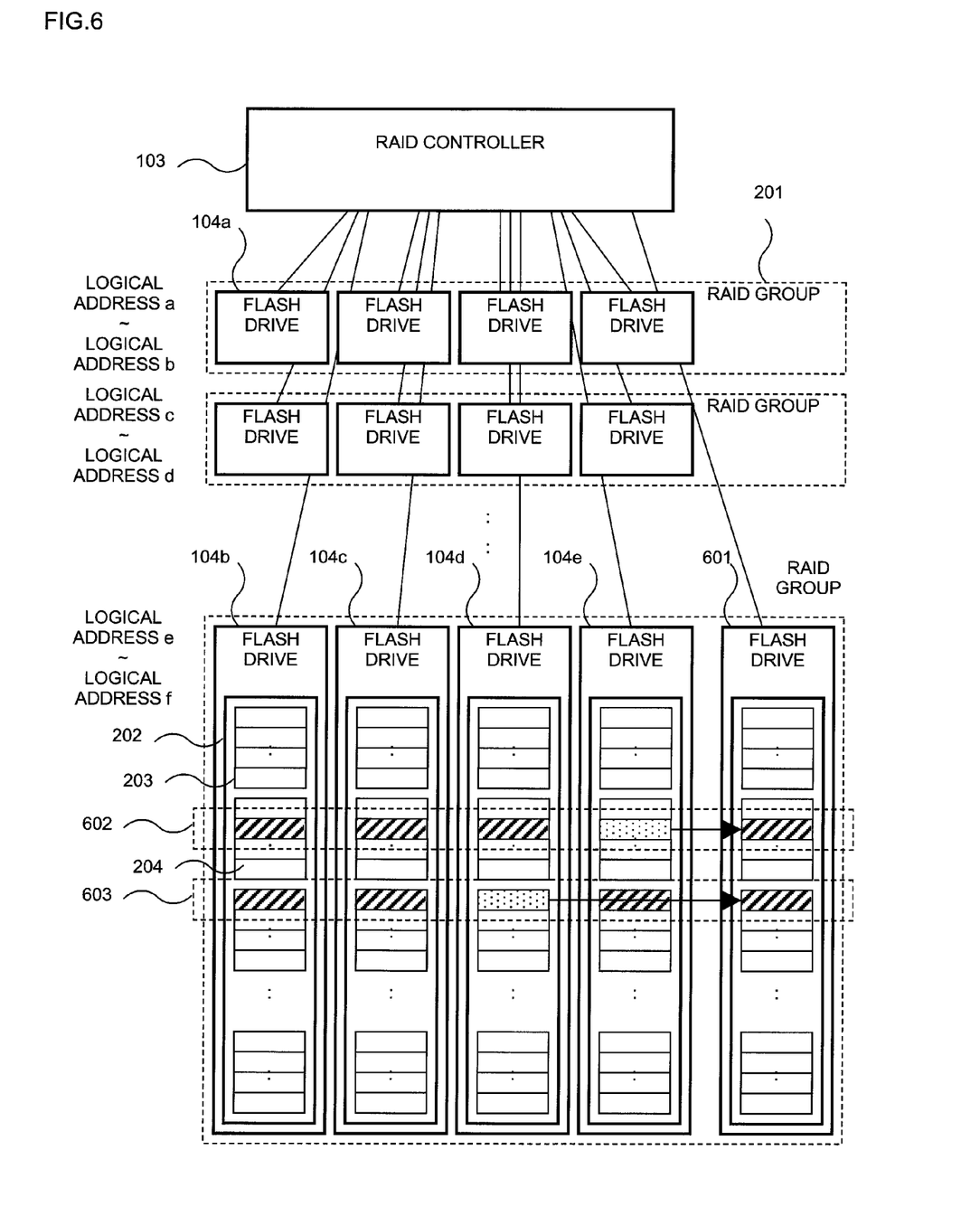
FIG. 6 is a schematic diagram of sector substitution between flash drives.

Then, a flash drive 601 is added to flash drives 104b, c, d and e forming a RAID group as shown in FIG. 6 so that the flash drive 601 to substitute for the flash drive which can no longer address writing. The substituting is only for writing data, and the originally included flash drive is used for reading data that has not been updated. For example, such an operation is taken; if writing to the flash drive 104e cannot be addressed in the parity group 602, data for the flash drive 104e is written into the flash drive 601; and if writing to the flash drive 104*d* cannot be addressed in the parity group 603, data for the flash drive 104*d* is written into the flash drive 601.

That operation has an effect in prolonging the lifetime of the entire external storage device only by adding a new flash drive to the RAID group after the four flash drives began to operate at the beginning of the operation and before any of the flash drives becomes to be unable to address writing so that the new flash drive substitutes for writing to the flash drive that is unable to address the writing to keep the capacity of the external storage device.

Figure 9:
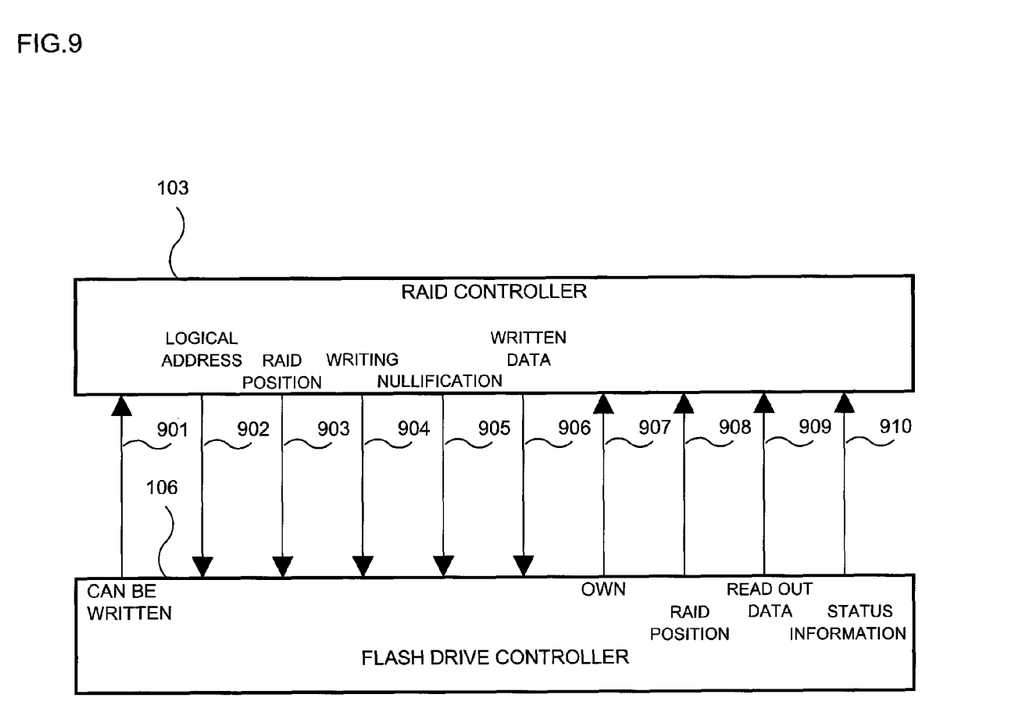
FIG. 9 is a schematic diagram of a flash drive interface.

As shown in FIG. 9, the flash drive 104 and the RAID controller 103 are interfaced by a logical address 902, a data owning signal 907, a writing enabled signal 901, a writing request 904, a nullification request 905, a data input 906, a RAID position 908 for performing data identification in a parity group of read out data, a RAID position 903 for performing data identification in a parity group in writing, and status information 910. The status information 901 includes information on the usage state of the flash memory such as the maximum number of times to delete a deletion unit and a ratio of the valid data. The signals and information may be respectively connected as independent signals or may take a form of a command and a response that are exchanged via a certain communication interface.

Figure 8:
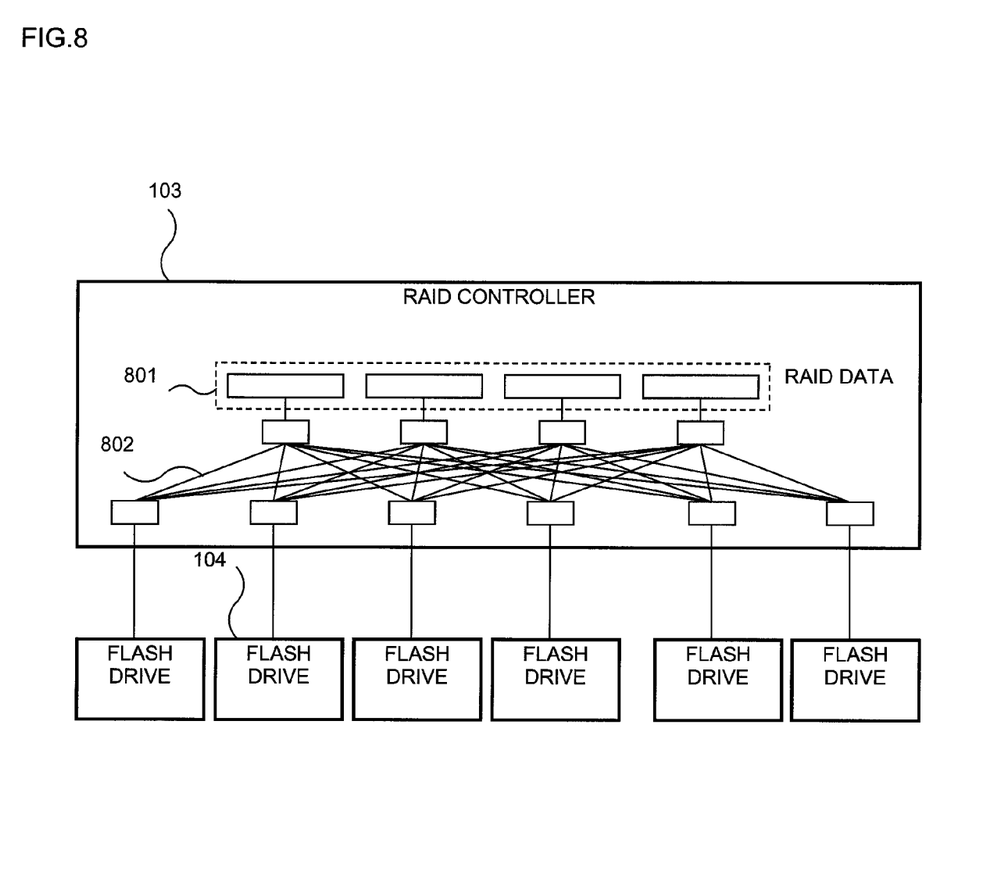
FIG. 8 is a schematic diagram of a flash drive data interface.

The RAID controller 103 is provided with a switch mechanism 802 for selecting four drives from the drives that can be connected inside a RAID group and sorting the data as shown in FIG. 8.

As shown in FIG. 4, when the RAID controller writes data, the logical address 401 sent from the host system 102 is conventionally converted into the drive address 403 and the logical address in a drive 404 by the RAID controller 103. The data 402 sent from the host system 102 is processed to four pieces of data of three pieces of writing units 407 and a piece of parity data 408. The four pieces of data are respectively stored in different flash drives as a rule.

Conventionally, the drive address 403 and the logical address in a drive 404 can be obtained by calculation by using the logical address 401. In the present invention, however, a flash drive that has a deletion unit that reached the limited number of times to delete of the flash memory may substitute the writing to the other flash drives so that which flash drive has the writing unit corresponding to the logical address therein needs to be managed. A superior RAID controller may manage it. In such a case, which flash drive is each writing unit present needs to be managed, requiring a large-scale conversion table.

Then, the RAID controller determines what superior to the logical address from the host system and examines which RAID group the data belongs to. The remaining logical address becomes a logical address inside the RAID group, which is sent to all the flash drives in the RAID group.

Each flash drive determines whether it owns data corresponding to the received logical address or not and answers whether it owns the data or not to the RAID controller by an owning signal 907. If the flash drive actually owns the data, it outputs the corresponding data as read out data 909 and outputs which data is among the three pieces of data in the parity group and a parity by the RAID position 908.

The RAID controller selects four flash drives which output owning signals from a plurality of flash derives inside the RAID group, checks respective RAID positions, sorts the pieces of data and restores the data.

If the owning signals are obtained only from three flash drives, the fourth flash drive is restored by using a RAID function and the data is restored.

If the owning signals are obtained only from two or less flash drives, the data cannot be restored by the RAID controller and the state is addressed as an error.

If the owning signals are obtained from five or more drives, old data in the same logical address and new data are included. Thus, if time and generation information are also managed, the data is restored by retrieving the latest data by using those pieces of data. If there is no time and generation information, the state is addressed as an error.

If the RAID controller writes data, it selects four flash drives that can be written among a plurality of flash drives in a RAID group, transfers the logical address 902, the RAID position information 903 and the data 906, and writes them by using the writing request signals 904. To the unselected flash drives, the logical address 902 and the nullification signal 905 are transferred. If the flash drive receives the logical address 902 and the nullification signal 905 and owns data corresponding to the logical address 902, it nullifies the data. If the flash drive does not own data corresponding to the logical address 902, it ignores the logical address 902 and the nullification signal 905.

Figure 11:
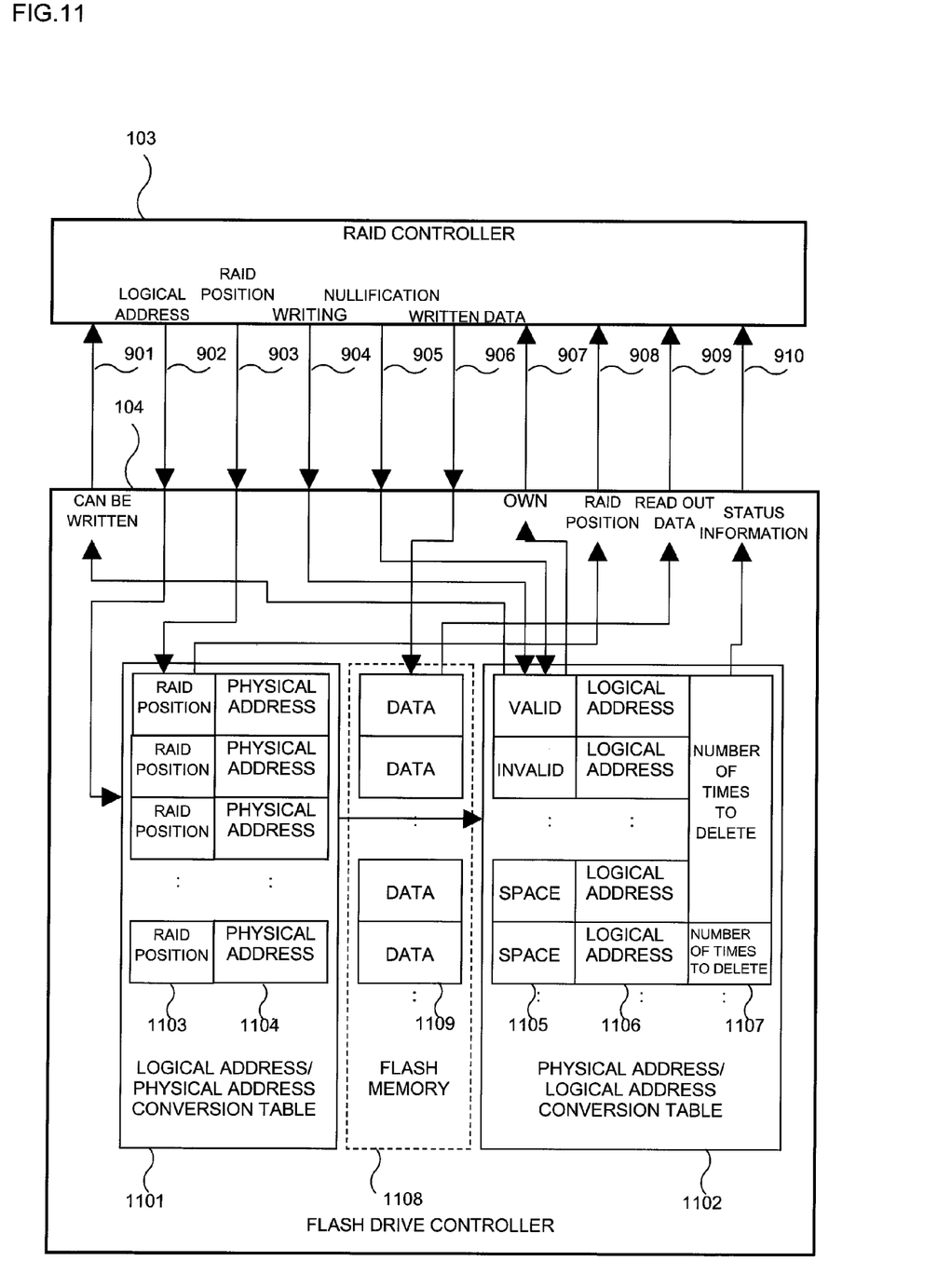
FIG. 11 is a schematic diagram of an owning data logical address search (1)

In FIG. 11, the flash drive controller 106 has a table 1101 for converting a given logical address to an address of the writing unit in an actual flash memory chip (physical address) and a conversion table 1102 for converting a physical address to a logical address.

A table for converting a logical address to a physical address stores RAID position information 1103 corresponding to a logical address and a physical address 1104. The conversion table has entries for writing unit capacity included in the flash drive.

An operation in writing data will be described. The flash drive controller 106 outputs a writing enabled signal 901 if the writing unit information-storing unit 1105 of a physical address logical address conversion table has space. When the RAID controller 103 selects the flash drive, the logical address 902, the RAID position information 903, the writing signal 904 and the writing data 906 are inputted. The flash drive controller 106 accesses the logical address physical address conversion table 1101 by using the inputted logical address as an entry, registers the inputted RAID position 1103, finds out a spaced writing unit from the physical address logical address conversion table 1102 and registers the physical address 1104. It validates the writing unit information-storing unit 1105 indicating the valid/invalid/space of the data in the physical address logical address conversion table 1102, writes the logical address to the logical address storing unit 1106 and writes data into a writing unit 1109 of the flash memory 1108 corresponding to the physical address.

An operation in reading out data will be described. The RAID controller 103 inputs the logical address 902 in reading. The flash drive controller 106 accesses the logical address physical address conversion table 1101 by using the inputted logical address as an entry and checks whether an effective physical address 1104 is registered or not. If the effective physical address 1104 is registered, the flash drive controller 106 accesses the physical address logical address conversion table 1102, checks the writing unit information-storing unit 1105 indicating the valid/invalid/space of the data. If the data is valid, outputs the data owning signal 907, the RAID position information 908 and the data 910 of the writing unit 1109 of the flash memory 1108 corresponding to the physical address.

If the nullification signal 905 is inputted instead of the writing signal 904 when the data is written, a physical address is obtained from the inputted logical address and the writing unit information-storing unit 1105 indicating the valid/invalid/space of the corresponding physical address logical address conversion table 1102 is nullified.

In the physical address logical address conversion table 1102, information 1107 on the number of times to delete is managed for each of the deletion unit, which is a set of a plurality of writing units, the maximum value inside the physical address logical address conversion table 1102 is examined and outputted as the status information 910.

The flash memory 1108 is described in the figure, but it is not present in the flash drive controller 106. The figure describes the flash memory 1108 to schematically show correspondence with the physical address logical address conversion table and a flow of data. The physical address logical address conversion table may be present in the flash drive controller or may be realized by using a region in a part of the flash memory. The logical address physical address conversion table may also be present in the flash drive controller or may be realized by using a region in a part of the flash memory.

If the RAID controller updates or overwrites a part of the data forming a parity group, it reads data from the parity group, updates or overwrites a part of the data, generates the parity data and writes it again in the flash drive.

If all the data forming the party group is overwritten, four flash drives that can answer a writing request are selected from the flash drives present in the RAID group, a writing request is given to each of the four flash drives, and a nullification request is given to the other flash derives in the RAID group.

If a writing request is given to the same logical address, the flash drive registers a physical address of the writing unit in a space state to the physical address of the logical address physical address conversion table 1101 and nullifies the writing unit information-storing unit 1105 of the previous physical address of the physical address logical address conversion table 1102.

Regularly or when the number of spaced writing units decreases to below a determined value, the flash drive examines the physical address logical address conversion table and finds out a deletion unit that has a high ratio of invalid writing units in a deletion unit. If an invalid state is more than a determined ratio, pieces of valid data in the deletion unit are transferred to a spaced writing unit one by one, all states of writing units in the original deletion unit are nullified and the deletion unit is deleted. At this moment, the transferred logical address of the writing units is checked and the logical address physical address conversion table is updated.

Any method can be taken for a RAID controller to select four flash drives from a RAID group, but the flash drives may be in prioritized. If a piece of data of a minimum unit is written, two parts of a corresponding data part and a parity in the corresponding parity group are updated and written in the corresponding flash drives. As a result, the number of times to rewrite a device of a deletion unit of the flash memory that forms a parity group is varied.

If the storage system is kept being operated, a fault occurs such as unable to delete or unable to write for each deletion unit of the flash memory in the flash drive. Substitute regions are prepared in the flash module or the flash drive to some extent to address the fault. If the storage system is further kept being operated, the flash drive may become unable to accept a writing request. This state can be predicted from information on the maximum number of times to delete. A method may be taken for adding a new flash drive to the RAID group when the maximum number of times to delete exceeds a predetermined value.

The flash drive can be added by one unit. If two flash drives that forms the RAID group cannot address a writing request, two writing units of four writing units that forms the parity group are written in a flash drive. Thus, it is difficult to read out data of the parity group at a time so that normal performance as the RAID system cannot be exerted. Therefore, a method can be taken for deciding the number of flash drives to be added by monitoring the maximum number of times to delete of the flash drives in the RAID group and comparing the maximum number with a predetermined value.

Focusing on a certain deletion unit, as a writing unit in the deletion unit is updated, a ratio of valid data in the deletion unit is decreasing. Each time the writing is done for the writing unit, a ratio of a valid data is also monitored. If the ratio becomes less than the predetermined value, valid data in the deletion unit is moved to the flash drive that can answer a writing request. At this moment, it is made that data forming the same parity group is not to be allocated to the same flash drive. As such, a flash drive moves valid data saved therein to another flash drive until the flash drive has run out of its lifetime, and the flash drive that has moved all the valid data can be removed from the RAID group.

Embodiment 2

The same thing can be done also in a flash module in a flash drive. That is to say, before deletion units that cannot to be deleted increase in a flash memory device to make it unable to address writing, a flash module is added and caused to substitute for the flash memory that is unable to address writing.

The second embodiment of the present invention will be described by using FIGS. 7, 10, and 12. A flash memory is added by the unit of the flash drive in the first embodiment; while a flash memory is added by the unit of a flash module in the flash drive in the second embodiment.

The flash module has a structure of a printed board provided with a plurality of flash memory devices and a controller for converting a logical address in the flash memory module and a physical address of the flash memory.

A flash drive controller for controlling a plurality of flash modules is in the flash drive.

In the first embodiment, the RAID position information is present as position information in the parity group is required for the RAID controller to access four flash drives at a time and retrieve data of a parity group, but the logical address physical address conversion table becomes simplified as whether data of writing unit is owned or not only needs to be checked in the flash module in the flash drive.

Figure 7:
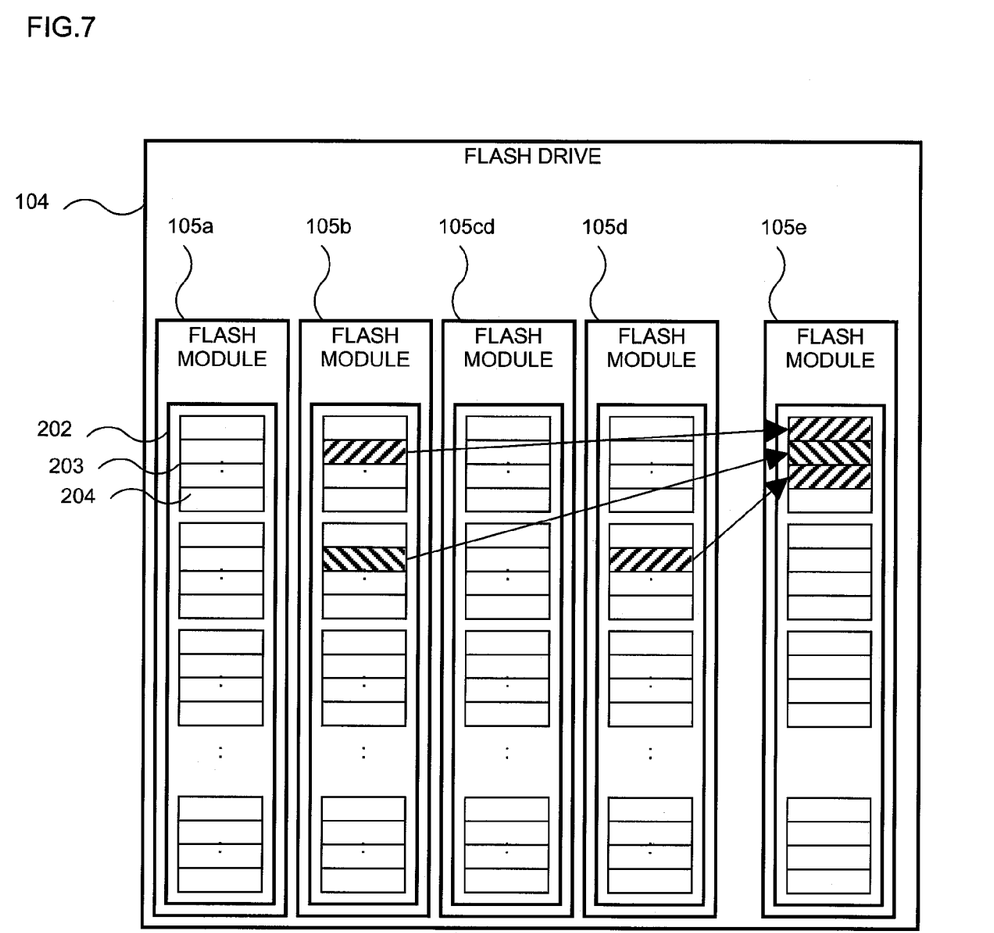
FIG. 7 is a schematic diagram of sector substitution between flash modules.

In FIG. 7, a plurality of flash modules 105 are in the flash drive 104 and a plurality of flash memories 202 are in the flash module 105. If the flash memory 202 is kept being used, a failure occurs such as it cannot be deleted or written by a deletion unit 203 or a writing unit 204. If multiple pieces of valid data are present in the flash memory 202 and a substituting region and the like cannot be deleted, data cannot be written in the flash memory. At this moment, a function of the flash drive 104 can be kept by adding a new flash module 105e and, for example, data in a writing unit corresponding to the flash modules 105b, 105d which no longer address the writing request is written to a new flash module 105e.

Figure 10:
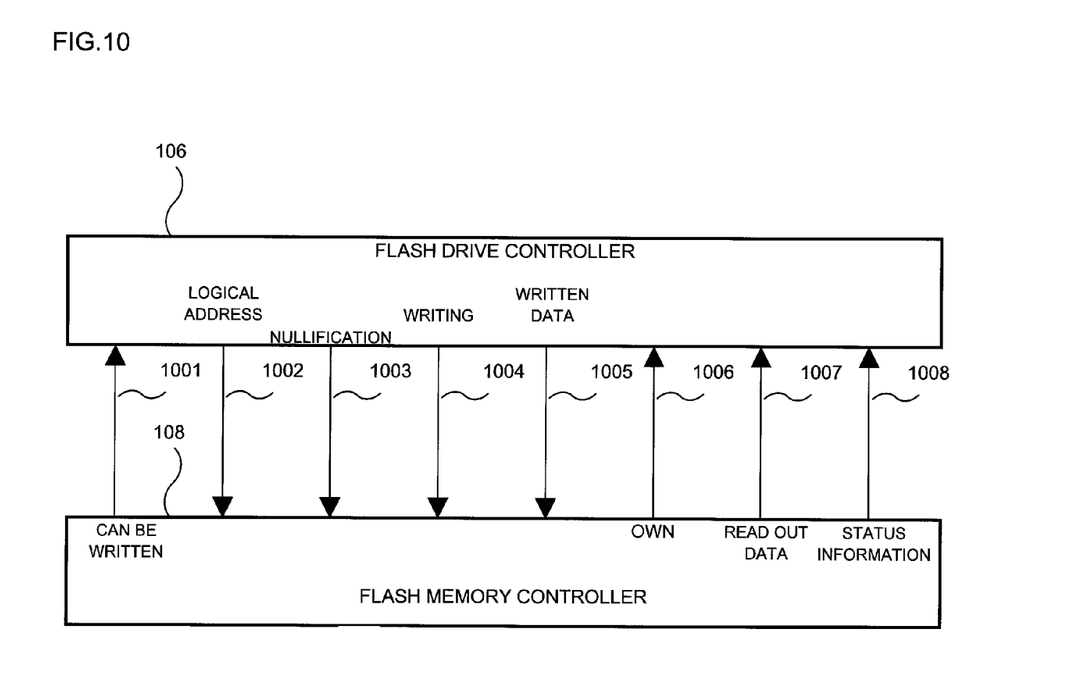
FIG. 10 is a schematic diagram of a flash module interface.

As shown in FIG. 10, the flash controller 108 and the flash drive controller 106 of the flash module are interfaced by a logical address 1002, a data owning signal 1006, a writing enabled signal 1001, a writing request 1004, a nullification request 1003, a data input 1005, a data output 1007 and status information 1008. The status information 1010 includes information on the usage state of the flash memory such as the maximum number of times to delete deletion units and a ratio of the valid data. The signals and information may be respectively connected as an independent signals or may take a form of a command and a response that are exchanged via a certain communication interface.

Figure 12:
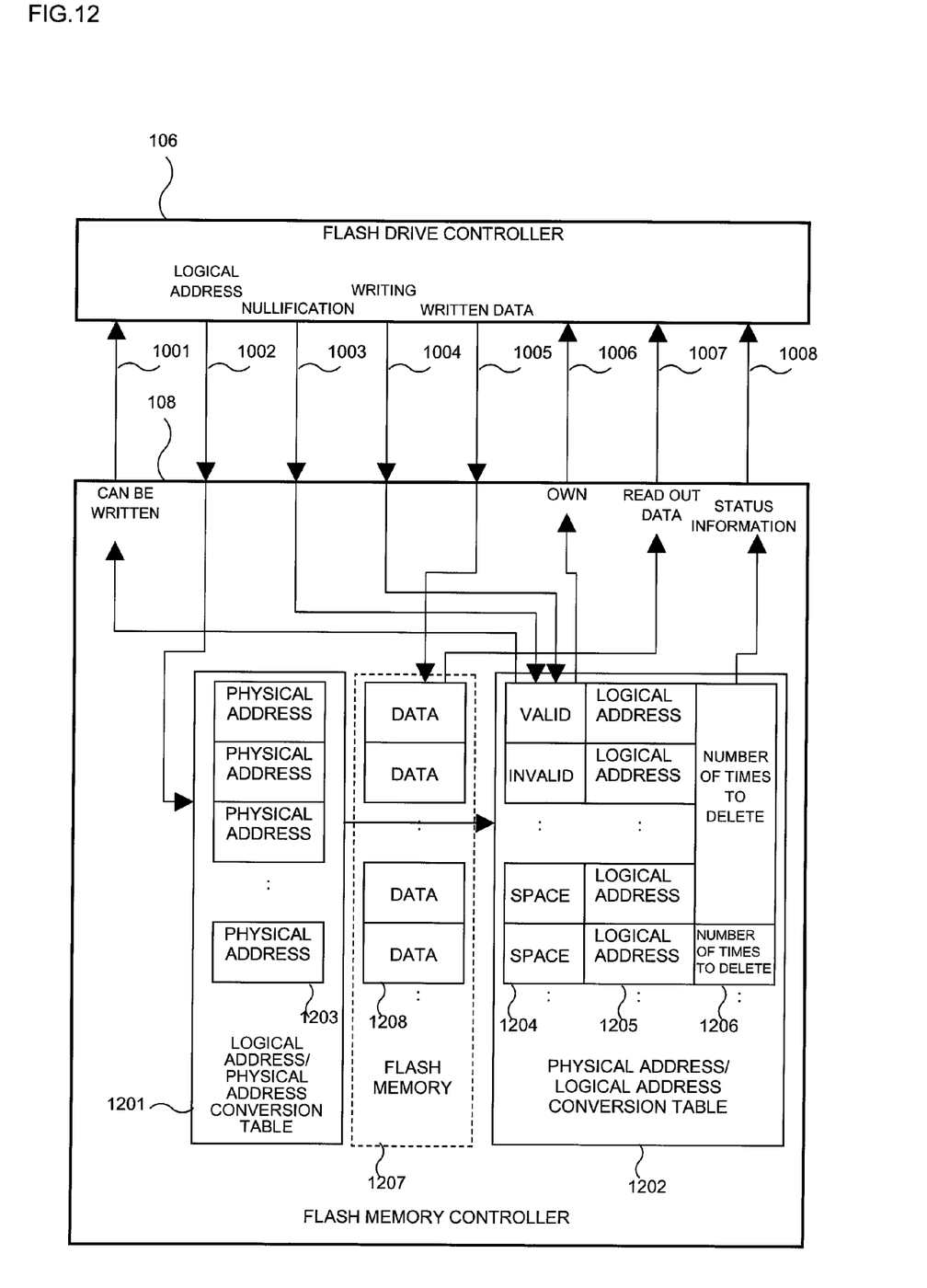
FIG. 12 is a schematic diagram of an owning data logical address search (2).

In FIG. 12, the flash memory controller 108 has a table 1201 for converting a given logical address to an address of the writing unit in an actual flash memory chip (physical address) and a conversion table 1202 for converting a physical address to a logical address.

A table 1201 for converting a logical address to a physical address stores a physical address 1203 corresponding to the logical address. The conversion table has entries for writing unit capacity included in the flash module.

An operation in writing data will be described. The flash memory controller 108 outputs a writing enabled signal 1001 if the writing unit information-storing unit 1204 of a physical address logical address conversion table has space. When the flash drive controller 106 selects the flash module, the logical address 1002, the writing signal 1004 and the writing data 1005 are inputted. The flash memory controller 108 accesses the logical address physical address conversion table 1201 by using the inputted logical address as an entry, finds out a spaced writing unit from the physical address logical address conversion table 1202 and registers the physical address 1203. The flash memory controller 108 validates a writing unit information storing unit 1204 indicating valid/invalid/space of data in the physical address logical address conversion table 1202, writes the logical address into the logical address storing unit 1205, and writes data into the writing unit 1208 of the flash memory 1207 corresponding to the physical address.

An operation in reading out data will be described. The flash drive controller 103 inputs a logical address 1002 in reading. The flash memory controller 108 accesses the logical address physical address conversion table 1201 by using the inputted logical address as an entry and checks whether a valid physical address 1203 is registered or not. If a valid physical address 1203 is registered, the flash drive controller 103 accesses the physical address logical address conversion table 1202, checks the writing unit information storing unit 1204 indicating valid/invalid/space of data. If the data is valid, it outputs a data owning signal 1006 and data 1007 of a writing unit 1208 of the flash memory 1207 corresponding to the physical address.

If the nullification signal 1003 is inputted instead of the writing signal 1004 in writing data, a physical address is obtained from the inputted logical address and the writing unit information-storing unit 1204 indicating valid/invalid/space of the corresponding physical address logical address conversion table 1202 is nullified.

In the physical address logical address conversion table 1202, information 1206 on the number of times to delete is managed for each of a deletion unit, which is a set of a plurality of writing units, the maximum value in the physical address logical address conversion table 1202 is examined and it is outputted as the status information 1008.

The flash memory 1207 is described in the figure, but it is not present in the flash memory controller 108. The figure describes the flash memory 1207 to schematically show correspondence with the physical address logical address conversion table and a flow of data. The physical address logical address conversion table may be present in the flash memory controller or may be realized by using a region in a part of the flash memory. The logical address physical address conversion table may also be present in the flash memory controller or may be realized by using a region of a part of the flash memory.

The flash drive controller selects a flash module from the flash modules that can answer the writing request among flash modules present in the flash drive, gives a writing request to the selected flash module, while giving a nullification request to the other flash modules in the flash drive.

If a writing request is given to the same logical address, the flash module registers a physical address of a spaced writing unit to the physical address of the logical address physical address conversion table 1201 and nullifies the writing unit information-storing unit 1204 of the previous physical address of the physical address logical address conversion table 1202.

Regularly or when the number of spaced writing units decreases to below a determined value, the flash module examines the physical address logical address conversion table and finds out a deletion unit that has a high ratio of invalid writing units in a deletion unit. If an invalid state is more than a determined ratio, pieces of valid data in the deletion unit are transferred to a spaced writing unit one by one, all states of writing units in the original deletion unit are nullified and the deletion unit is deleted. At this moment, the transferred logical address of the writing unit is checked and the logical address physical address conversion table is updated.

Any method can be taken for the flash drive controller to select a flash module from a flash drive, but the modules may be prioritized.

As described above, according to the present invention, a storage system, which is characterizes the flash memory, that enables the capacity in the beginning of the operation to be kept by adding a flash memory in response to a failure for each of the deletion unit. The storage system can be maintained with a minimum cost by adding a functional module such as a module of the flash memory or a drive.

A first aspect of the present invention is a storage device equipped with two or more memory device units with a plurality of semiconductor memory devices, each of which has a functional capacity unit smaller than an entire capacity of semiconductor memory devices and has a writing lifetime for each functional capacity unit, wherein only a functional capacity unit whose writing lifetime is run out to be determined as unable to be written in a semiconductor memory device of a memory device unit is substituted by a functional capacity unit in a semiconductor memory device of another memory device unit to keep a predetermined capacity of the entire device.

A second aspect of the present invention is the storage device according to the first aspect, wherein the memory device unit is a memory module formed by a plurality of semiconductor memory devices, each of which has a functional capacity unit smaller than an entire capacity of semiconductor memory devices and has a writing lifetime for each functional capacity unit, and a memory controller with a function for converting physical address information for accessing the semiconductor memory device and logical address information, wherein only a functional capacity unit whose writing lifetime is run out to be determined as unable to be written in a semiconductor memory device of a memory module is substituted by a functional capacity unit in a semiconductor memory device of another memory module.

A third aspect of the present invention is the storage device according to the first aspect, wherein the memory device unit is a drive formed by a plurality of memory modules, each of which is formed by a plurality of semiconductor memory devices, each of which has a functional capacity unit smaller than an entire capacity of semiconductor memory devices and has a writing lifetime for each functional capacity unit, and a memory controller with a function for converting physical address information for accessing the semiconductor memory device and logical address information; and a drive controller with a function for converting physical address information for accessing the semiconductor memory device of the memory module and logical address information, wherein only a functional capacity unit whose writing lifetime is run out to be determined as unable to be written in a semiconductor memory device of a memory module of a drive is substituted by a functional capacity unit in a semiconductor memory device of a memory module of another drive.

A fourth aspect of the present invention is the storage device according to the second or the third aspect, wherein a memory controller or a drive controller of the memory device unit gives a logical address to the semiconductor memory device of the memory device unit and determines whether the semiconductor memory device of the memory device unit stores data corresponding to the logical address or not, and the semiconductor memory device of a memory device unit for reading out data is selected based on the determination.

A fifth aspect of the present invention is the storage device according to the second or the third aspect, wherein a writing unit is selected from a semiconductor memory device of a plurality of memory device units one by one, the plurality of writing units forming a redundant configuration, and wherein the memory controller or the drive controller of the memory device unit returns information on whether it can accept a writing request or not, and a semiconductor memory device of the memory device unit that can address the writing is selected based on the returned information.

A sixth aspect of the present invention is the storage device according to the second or the third aspect, wherein writing units are selected from a semiconductor memory device of a plurality of memory device units one by one, the plurality of writing units forming a redundant configuration, and wherein the memory controller or the drive controller writes additional information including an order of the pieces of data, kinds of data such as a parity and an arrangement of the pieces of data at a time when the redundant configuration is taken, and correct data is restored based on the additional information when the writing units are read out.

A seventh aspect of the present invention is the storage device according to the second or the third aspect, wherein the memory controller or the drive controller saves information on relationship with a logical address for each of the functional capacity unit of the semiconductor memory device and creates information on relationship with an added logical address of an added semiconductor memory device when the semiconductor memory device is added.

An eighth aspect of the present invention is a storing method using a storage device equipped with two or more memory device units with a plurality of semiconductor memory devices, each of which has a functional capacity unit smaller than an entire capacity of semiconductor memory devices and has a writing lifetime for each functional capacity unit, including a step of storing only a functional capacity unit whose writing lifetime is run out to be determined as unable to be written in a semiconductor memory device of a memory device unit by substituting the functional capacity unit by a functional capacity unit in a semiconductor memory device of another memory device unit to keep a predetermined capacity of the entire device.

A ninth aspect of the present invention is the storing method according to the eighth aspect, wherein the memory device unit is a memory module formed by a plurality of semiconductor memory devices, each of which has a functional capacity unit smaller than an entire capacity of semiconductor memory devices and has a writing lifetime for each functional capacity unit, and a memory controller with a function for converting physical address information for accessing the semiconductor memory device and logical address information, including a step of storing only a functional capacity unit whose writing lifetime is run out to be determined as unable to be written in a semiconductor memory device of a memory module by substituting the functional capacity unit by a functional capacity unit in a semiconductor memory device of another memory module.

A tenth aspect of the present invention is the storing method according to the eighth aspect, wherein the memory device unit is a drive formed by a plurality of memory modules, each of which is formed by a plurality of semiconductor memory devices, each of which has a functional capacity unit smaller than an entire capacity of semiconductor memory devices and has a writing lifetime for each functional capacity unit, and a memory controller with a function for converting physical address information for accessing the semiconductor memory device and logical address information; and a drive controller with a function for converting physical address information for accessing the semiconductor memory device of the memory module and logical address information, wherein only a functional capacity unit whose writing lifetime is run out to be determined as unable to be written in a semiconductor memory device of a memory module by substituting the functional capacity unit by a functional capacity unit in a semiconductor memory device of another memory module.

An eleventh aspect of the present invention is the storing method according to the eighth aspect, further including the steps of: giving a logical address to a semiconductor memory device of the memory device unit; determining whether the semiconductor memory device of the memory device unit stores data corresponding to the logical address or not; and selecting the semiconductor memory device of the memory device unit for reading out data based on the determination.

A twelfth aspect of the present invention is the storing method according to the eighth aspect, further including the steps of: selecting writing units from a plurality of semiconductor memory devices one by one, with the plurality of writing units forming a redundant configuration; returning information on whether the memory device unit accepts a writing request or not; and selecting the semiconductor memory device of the memory device unit that can address writing based on the returned information.

A thirteenth aspect of the present invention is the storing method according to the eighth aspect, further including the steps of: selecting writing units from a semiconductor memory device of a plurality of memory device units one by one, with the plurality of writing units forming a redundant configuration; writing additional information including an order of the pieces of data, kinds of data such as a parity and an arrangement of the pieces of data at a time when the redundant configuration is taken; and restoring correct data based on the additional information when the writing units are read out.

A fourteenth aspect of the present invention is the storing method according to the eighth aspect, including the steps of: saving information on relationship with a logical address for each functional capacity unit of the semiconductor memory device; and creating information on relationship with an added logical address of an added semiconductor memory device when the semiconductor memory device is added.

What is claimed is:

1. A storage device comprising:
    a RAID controller unit controlling a read request and a write request from a host unit; and
    a storage unit having a plurality of flash drives each flash drive comprising a drive controller and a plurality of flash memory devices in which a functional capacity unit is smaller than an entire capacity of the flash memory devices, wherein the drive controller of each flash drive determines a writing lifetime for each functional capacity unit in the flash drive,
    wherein the drive controller of a first flash drive upon determining at least one functional capacity unit of the flash memory devices in which the writing lifetime exceeds a predetermined value, replaces the at least one functional capacity unit by a functional capacity unit of flash memory devices of a second flash drive, and
    wherein, if the data of the at least one functional capacity unit has not been updated, the drive controller of the first flash drive controls to read data of the at least one functional capacity unit from the flash memory devices of the first flash drive in response to a read request from the host unit, and wherein the drive controller of the second flash drive controls to write data of the at least one functional capacity unit to the flash memory devices of the second flash drive in response to a write request from the host unit.

2. The storage device according to claim 1, wherein the drive controller converts between physical address information for accessing the flash memory devices and logical address information.

3. The storage device according to claim 2, wherein the drive controller manages mapping information of the physical address information and the logical address information of the flash memory devices and the RAID controller unit receives the mapping information from the drive controller.

4. The storage device according to claim 2, wherein the drive controller determines whether the flash memory device stores data corresponding to the logical address or not, and the flash memory device for reading out data is selected by the RAID controller unit based on the determination.

5. The storage device according to claim 2, wherein the first flash drive and the second flash drive are configured as a RAID group.

6. The storage device according to claim 5, wherein the drive controller stores attribute information of redundant configuration based on a writing unit in the flash memory.

7. A storing method using a storage device including a RAID controller unit controlling a read request and a write request from a host unit, and a storage unit having a plurality of flash drives each comprising a drive controller and a plurality of flash memory devices in which a functional capacity unit is smaller than an entire capacity of the flash memory devices, said storing method comprising the steps of:
    determining, by the drive controller of each flash drive, a writing lifetime for each functional capacity unit in the flash drive;
    upon the drive controller of a first flash drive upon determining at least one functional capacity unit of the flash memory devices in which the writing lifetime exceeds a predetermined value, replacing the at least one functional capacity unit by a functional capacity unit of flash memory devices of a second flash drive, and
    controlling, by the drive controller of the first flash drive if the data of the at least one functional capacity unit has not been updated, to read data of the at least one functional capacity unit from the flash memory devices of the first flash drive in response to a read request from the host unit; and
    controlling, by the drive controller of the second flash drive, to write data of the at least one functional capacity unit to the flash memory devices of the second flash drive in response to a write request from the host unit.

8. A storing method according to claim 7, wherein the drive controller converts between physical address information for accessing the semiconductor memory device and logical address information.

9. A storing method according to claim 8, wherein the drive controller manages mapping information of the physical address information and the logical address information of the flash memory devices and the RAID controller unit receives the mapping information from the drive controller.

10. The storing method according to claim 8, wherein the drive controller determines whether the flash memory device stores data corresponding to the logical address or not and the flash memory device for reading out data is selected based on the determination.

11. The storing method according to claim 8, wherein the first flash drive and the second flash drive are configured as a RAID group.

12. The storing method according to claim 11, wherein the drive controller stores attribute information of redundant configuration based on a writing unit in the flash memory.

* * * * *